United States Patent
Masaki

[11] Patent Number: 6,166,446
[45] Date of Patent: Dec. 26, 2000

[54] SEMICONDUCTOR DEVICE AND FABRICATION PROCESS THEREOF

[75] Inventor: Yasuyuki Masaki, Nagano-ken, Japan

[73] Assignee: Seiko Epson Corporation, Tokyo, Japan

[21] Appl. No.: 09/180,932
[22] PCT Filed: Mar. 3, 1998
[86] PCT No.: PCT/JP98/00865
§ 371 Date: May 18, 1999
§ 102(e) Date: May 18, 1999
[87] PCT Pub. No.: WO98/42022
PCT Pub. Date: Sep. 24, 1998

[30] Foreign Application Priority Data

Mar. 18, 1997 [JP] Japan ................................. 9-065176

[51] Int. Cl.⁷ .................................................. H01L 23/28
[52] U.S. Cl. .......................... 257/796; 257/675; 257/706; 257/720; 257/712; 257/717; 257/729; 257/783; 438/124; 438/126; 438/127
[58] Field of Search ................................ 257/796, 675, 257/706, 720, 712, 717, 729, 783; 438/124, 126, 127

[56] References Cited

U.S. PATENT DOCUMENTS

| | | | |
|---|---|---|---|
| 3,864,217 | 2/1975 | Takahata et al. | 29/840 |
| 5,583,371 | 12/1996 | Hori | 287/675 |
| 5,783,860 | 7/1998 | Jeng et al. | 257/675 |
| 5,929,513 | 7/1999 | Asano et al. | 257/675 |
| 5,929,514 | 7/1999 | Yalamanchili | 257/676 |

FOREIGN PATENT DOCUMENTS

| | | |
|---|---|---|
| 62-166553 | 7/1962 | Japan . |
| 53-10269 | 1/1978 | Japan . |
| 53-79381 | 7/1978 | Japan . |
| 56-21450 | 2/1981 | Japan . |
| 56-36159 | 4/1981 | Japan . |
| 63-169747 | 7/1988 | Japan . |
| 4-116963 | 4/1992 | Japan . |
| 7-66328 | 3/1995 | Japan . |
| 7-122696 | 5/1995 | Japan . |
| 7-263605 | 10/1995 | Japan . |
| 8-111491 | 4/1996 | Japan . |
| 8-130286 | 5/1996 | Japan . |
| 8-181267 | 7/1996 | Japan . |
| 08070082 | 12/1996 | Japan . |

Primary Examiner—David Hardy
Assistant Examiner—Jhihan B Clark
Attorney, Agent, or Firm—Oliff & Berridge, Plc.

[57] ABSTRACT

A semiconductor device in which defective resin filling can be prevented. One embodiment has a metal heat-releasing plate (103) with good thermal conductivity, which is sealed within a resin portion (107). An inner lead (101) is attached to the heat-releasing plate (103) and is at the same time provided with a bent portion. The heat-releasing plate (103) is located at the center of the resin portion (107) in its thickness-wise direction. The above arrangement roughly equalizes the spaces above and under the heat-releasing plate (103), thereby improving the resin filling performance to enable fabrication of a semiconductor device without causing defective resin filling such as an unfilled portion.

17 Claims, 5 Drawing Sheets

SEMICONDUCTOR DEVICE AND FABRICATION PROCESS THEREOF

TECHNICAL FIELD

The present invention relates to a semiconductor device with improved heat-releasing capability and a process for fabricating the same.

BACKGROUND ART

FIG. 7 illustrates a semiconductor device with improved heat releasing capability in the prior art. Of leads shown, at least a part of an inner lead 501 is pasted with a nonconductive tape 502 to a heat-releasing block 504 comprising a metallic or other type of material. A semiconductor element 503 is pasted with an epoxy resin not shown in the illustration onto the heat-releasing block 504. The electrode on the semiconductor element 503 and the inner lead 501 is connected with a wire 505 such as a gold wire or the like. These components are sealed with a sealing resin 506, and an outer lead 507 is extracted from the sealing resin 506.

Note here that the general practice is to extract the outer lead 507 from the midpoint of the thickness of the sealing resin 506.

According to the above description, since the heat-releasing block 504 is locate off-centered to one side (i.e. lower side in the illustration) of the sealing resin 506 as seen from its thickness-wise direction, the flow of the sealing resin above and underneath become irregular at the time of resin sealing, thus causing defects such as an unfilled portion. In other words, difference between the spaces above and under the heat-releasing block 504 to the metal forming mold causes a variance in filling speed at the time the sealing resin is injected, delaying the filling of the lower metal forming mold and thus causing a faulty filling. Such a faulty fill is apt to occur particularly when a large and thick heat-releasing block is employed to improve the heat-releasing capability.

While the above-mentioned problem could be solved by making the heat-releasing block thinner, it gives rise to another problem whereby a thinner heat-releasing block could only provide an inferior heat-releasing capability. For instance, for a 3-mm package of a semiconductor device, a heat-releasing plate having a thickness of about 0.5 mm has caused a faulty fill. If a heat-releasing plate of about 1.5 mm in thickness is used to avoid the trouble, heat-releasing capability may be insufficient.

Accordingly, with an aim at eliminating the above-described problems in the prior art, it is an object of the present invention to provide a semiconductor device in which defective resin filling can be prevented and a process for fabricating the same.

DISCLOSURE OF THE INVENTION (1) A resin-sealed type semiconductor device of the present invention comprises:
 a semiconductor element having electrodes;
 a radiator facilitating divergence of heat from the semiconductor element;
 a lead having an inner lead portion and an outer lead portion; and
 a resin portion sealing and embedding the semiconductor element, the radiator and the inner lead portion, the semiconductor element and the inner lead portion attached to the radiator, the radiator placed to straddle a center of a thickness-wise direction of the resin portion, the inner lead portion formed with its end placed at a position deviated from the center of the thickness-wise direction of the resin portion, the inner lead portion bent toward a direction of the center of the thickness of the resin portion, and the outer lead portion protruding from a position of the center of the thickness of the resin portion.

In accordance with the present invention, the radiator straddled the center of the thickness of the resin portion. Such a configuration is enabled by the inner lead portion formed with its end placed at a position deviated from the center of a thickness-wise direction of the resin portion, and at the same time bent toward the direction of the center of the thickness of the resin portion. The above-mentioned arrangement roughly evens the spaces above and under the radiator to the metal forming mold. It therefore equalizes the flow of the resin above and under the radiator at the time of resin sealing, thus preventing a faulty filling.

(2) The semiconductor element may be attached approximately at a central region of the radiator in a direction perpendicular to the thickness-wise direction of the resin portion, and the inner lead portion may be attached at an outer perimeter of the radiator on a side of the radiator to which the semiconductor element is attached.

(3) The semiconductor element may be attached to one side of the radiator, and the inner lead portion may be attached to another of the side of the radiator.

(4) The radiator may be made of aluminum and be provided with a porous surface by anodic oxidation treatment.

(5) The surface of the radiator may be treated with a roughening finish.

(6) The surface of the radiator may be treated with ceramic flame-spraying.

(7) The surface of the radiator may be treated with a blackening finish.

(8) The inner lead portion of the lead may be attached to the radiator via a dielectric material having adhesive materials on both of its sides, the inner lead portion may be attached so that it intrudes into one of the adhesive materials of the dielectric material.

(9) The inner lead portion of the lead may be attached to the radiator via a dielectric material having adhesive materials on both of its sides, the dielectric material may have its end positioned under a tip of the inner portion on a center side of the radiator.

(10) A method for fabricating the semiconductor device in accordance with the present invention comprises:
 a first step of placing at predetermined positions a semiconductor element having electrodes, a lead having an outer lead portion and a partially bent inner lead portion, and a radiator to which the semiconductor element and the inner lead portion are attached, the radiator facilitating divergence of heat from the semiconductor element; and,
 a second step of forming a resin portion sealing the semiconductor element, the radiator, and the inner lead portion of the lead, in the first step, the radiator is placed at a position intersecting a center of a thickness of the resin portion, and a junction between the inner lead portion and the outer lead portion is placed at the center of the thickness of the resin portion through a bent portion of the inner lead portion.

In accordance with the present invention, the radiator is placed at a position intersecting the center of the thickness of the resin portion. Such a configuration is enabled by bending the inner lead portion toward the direction of the center of the thickness of the resin portion. The arrangement makes it possible to bring the spaces above and under the radiator to the inner surface of the metal forming mold roughly even. It therefore equalizes the flows of the resin above and under the radiator at the time of resin sealing, thus preventing a faulty filling.

(11) The radiator may be made of aluminum, and the radiator may be provided with anodic oxidation treatment prior to performing the first step.

(12) Prior to performing the first step, the radiator may be provided with an electroplating treatment using an electric current density that is large enough to cause a surface roughening phenomenon.

(13) The radiator may be treated with sandblasting to roughen a surface of the radiator prior to performing the first step.

(14) Prior to performing the first step, the surface of the radiator may be treated with ceramic flame-spraying.

(15) Prior to performing the first step, the surface of the radiator may be treated with a blackening finish.

(16) The first step may comprise:
 a step of attaching the inner lead portion of the lead to the radiator via a dielectric material having adhesive materials on its both sides; and
 a step of applying a pressure between the inner lead portion and the dielectric material so that the inner lead portion is caused to intrude into one of the adhesive materials on the dielectric material.

(17) The first step may comprise:
 a step of pasting a dielectric material having adhesive materials on both of its sides to an outer perimeter of the radiator;
 a step of pasting the inner lead portion to the dielectric material in such a way that the inner lead portion extends at least to an end of the dielectric material on a side of a center of the radiator or closer to the center; and
 a step of applying pressure to an area between the inner lead portion and the radiator.

BEST MODE FOR CARRYING OUT THE INVENTION

Figure 1:
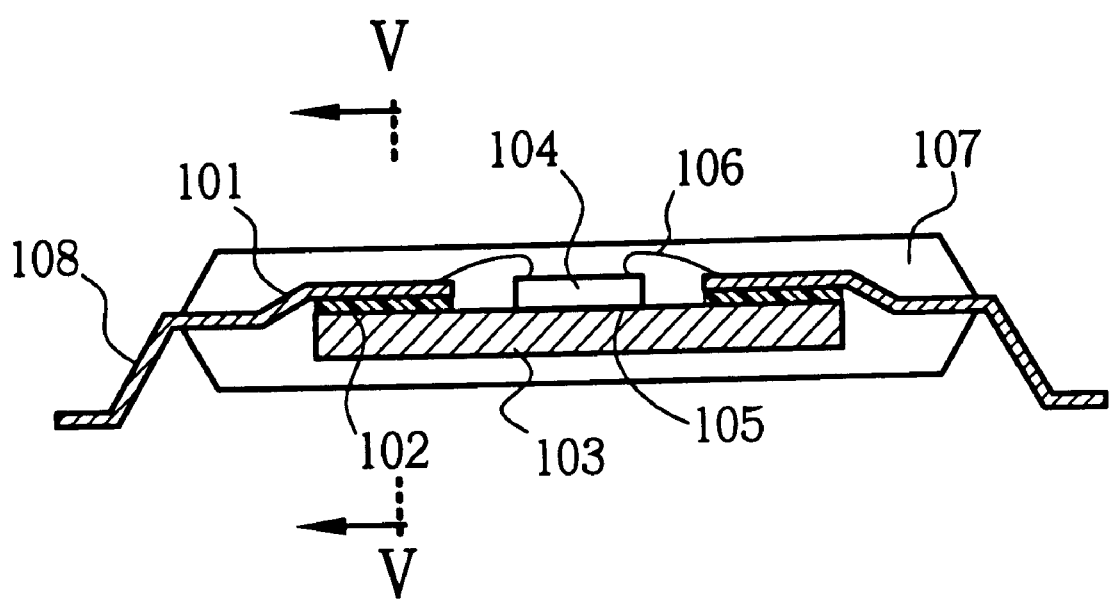
FIG. 1 is a view illustrating a semiconductor device in accordance with one embodiment of the present invention.

In the following sections, preferred embodiments of the present invention are explained in more detail. FIG. 1 is a schematic view illustrating a cross-section of a semiconductor device in accordance with one embodiment of the present invention. The semiconductor device comprises a semiconductor element 104, a heat-releasing block 103, and leads comprise an inner lead 101 and an outer lead 108.

The inner lead 101 is formed in a partially bent shape and fixed with a nonconductive tape 102 to the heat-releasing block 103 made of a metal such as copper, aluminum, or the like, or another material, and has a plate like shape. The tape 102 is pasted along the outer perimeter of the heat-releasing block 103. The semiconductor element 104 is fixed to the heat-releasing block 103 with a resin 105 such as an epoxy resin with good thermal conductivity. More specifically, semiconductor element 104 is fixed approximately at the center on the face of the heat-releasing block 103 to which the inner lead 101 is attached. The electrode pad (not shown in the illustration) on the semiconductor element 104 and the inner lead 101 are connected by a wire 106, such as gold wire or the like. Further, the semiconductor element 104, the heat-releasing block 103, and the inner lead 101 are sealed within a resin portion 107. Sealing the heat-releasing block 103 within the resin portion 107 prevents the heat-releasing block 103 from exposing outside, and protects it from corrosion or other damage. Additionally, the outer lead 108 is extracted from the midpoint of the thickness of the resin portion 107. The inner lead 101 is bent toward the direction of the center of the thickness of the resin portion 107 so that the outer lead 108 can be pulled out from the above position.

The outer lead 108 may be formed either toward the opposite direction of the semiconductor element 104 as shown in the illustration, or in the same direction the semiconductor element is attached. Also, while the outer lead 108 shown in the illustration is in a gull-winged shape, its shape is not limited thereto.

According to the present embodiment, the thickness of the resin portion 107 (i.e. the package thickness) is approximately 3 mm and the heat-releasing block 103 has a thickness of approximately 1 mm. To enable a satisfactory level of heat divergence, the thickness of the heat-releasing block 103 is set be about one-third of the package thickness as described above. Further, it is preferable to keep the size of the heat-releasing block 103 within a range of 30 to 80% (particularly preferably 65 to 75%) of the size of the resin portion 107 (package size), because such an arrangement can prevent exposure of the heat-releasing block 103 from the resin portion 107.

According to the present embodiment, the heat-releasing block 103 is placed at a position intersecting the center of the thickness of the resin portion 107. Further, the thickness of the resin portion 107 on the two sides of the heat-releasing block 103 is made to be roughly equal.

The fabrication process of the semiconductor device of the present invention includes a step of sealing the semiconductor device within metal forming molds above and underneath it with resin. As described previously using a prior art example, when the spaces above and under the heat-releasing block to the metal forming mold differ, a variance in flow speed of the sealing resin to cause a faulty filling or an unfilled portion occurs. In the present invention, the heat-releasing block 103 is placed at a position intersecting the center of the thickness of the resin portion 107 by forming the inner lead 101 with a bent portion. Such an arrangement makes it possible to even the spaces from above and under the heat-releasing block 103 to the metal forming mold. It therefore equalizes the flow of the resin to prevent defects such as an unfilled portion.

Additionally, it is preferably to provide the above heat-releasing block 103 with a surface roughening treatment from the standpoint of adhesion with the resin portion 107. The above may be achieved by providing the heat-releasing block 103 with an electroplating using a large electric current density to form a plated layer having a coarse surface. More specifically, the above process can be applied when a copper plating is provided on a heat-releasing block 103 made of copper. Alternatively, anodic oxidation may be used when the heat-releasing block 103 is composed of aluminum. Another alternative is to strike the heat-releasing block 103 with hard particles by a sand blasting to provide the surface with a roughening finish. Another option is to glaze the surface of the heat-releasing block 103 with ceramic by ceramic flame-spraying. Yet another option is to chemically oxidize the surface of the heat-releasing block 103 with a blackening treatment.

With the above-mentioned methods, the surface of the heat-releasing block becomes porous, thus improving adhesion with the resin portion 107. Moreover, when ceramic flame-spraying or blackening treatment is applied, formation of a thermally induced oxide film having weak adhesion with the resin can be prevented since a ceramic film or a chemically formed oxide film is formed by such a treatment. Note that the aforementioned methods for improving adhesion with the resin could as well be applied equally to all other embodiments presented herein.

Figure 2A:
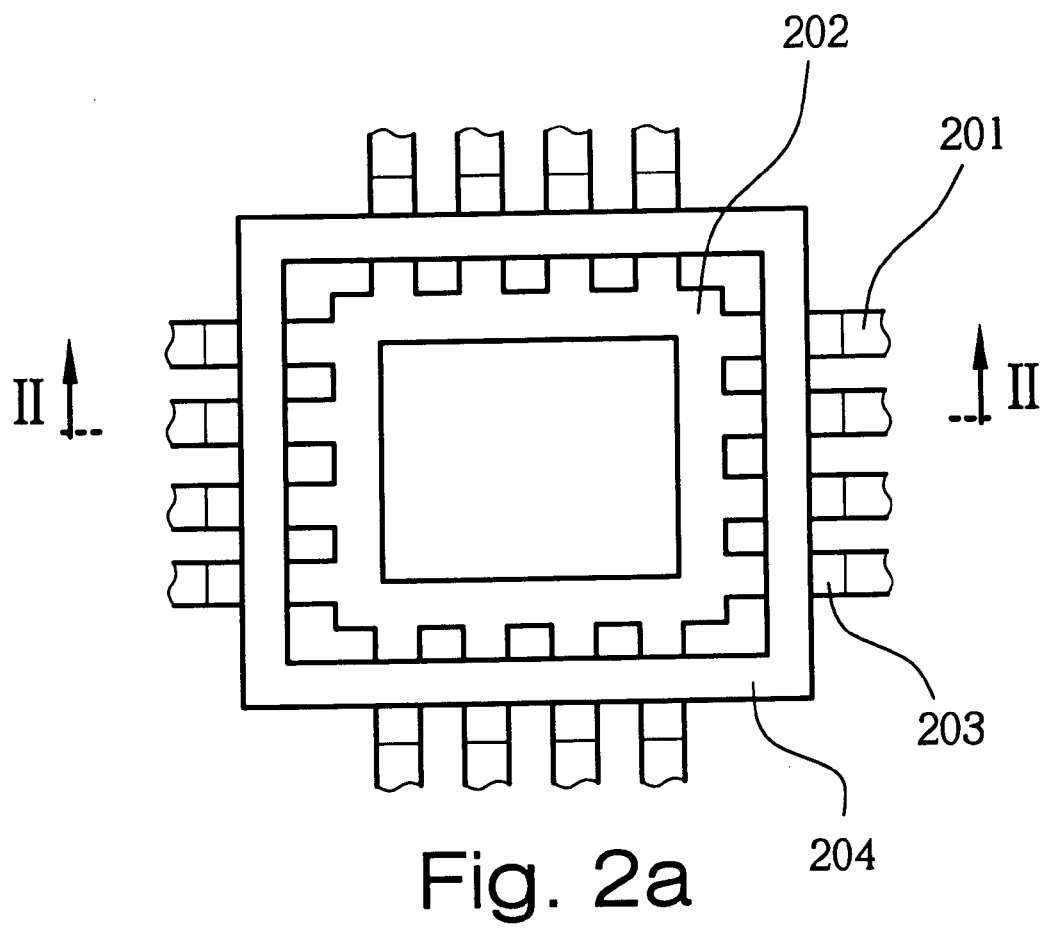
FIGS. 2A and 2B vies illustrating the leads in accordance with one embodiment of the present invention.
Figure 2B:

FIGS. 2A and 2B are schematic views illustrating the leads in accordance with another embodiment of the present invention, with FIG. 2B providing a cross-sectional view through the II—II plane of FIG. 2A.

After fabricating an inner lead 201 in one piece together with a support portion 202 either by a pressing or a photo-etching technique, a bent portion 203 is formed by pressing, and a nonconductive tape 204 is bonded. Since the bent portion 203 is formed by pressing on the inner lead 201 while it is connected to the support portion 202 as described above, it enables to reliably fabricate the inner lead 201 while avoiding warping or other irregularity. Moreover, if the support portion 202 is cut off only after the tape 204 for fastening the inner lead 201 to the heat-releasing block is attached and the inner lead 201 fixed to the heat-releasing block, it provides additional protection against warping or fluttering of the inner lead 201.

Figure 3:
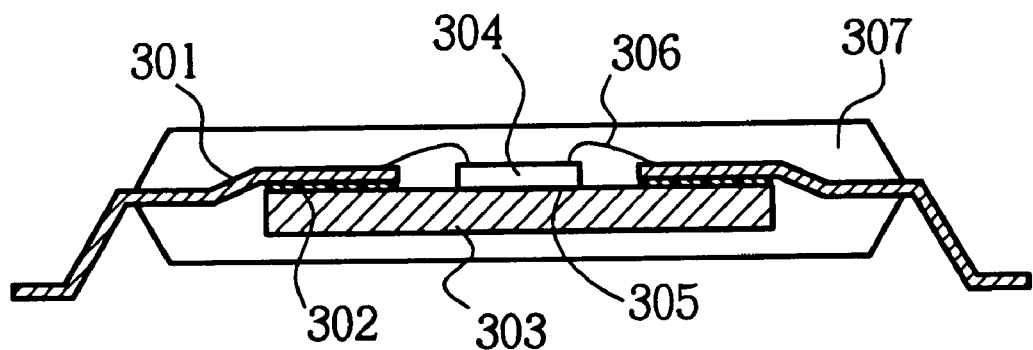
FIG. 3 is a view illustrating a semiconductor device in accordance with another embodiment of the present invention.

FIG. 3 is a view illustrating another embodiment of the present invention. It provides a cross-sectional view of a semiconductor device fabricated by fixing an inner lead 301 having a bent portion to a heat-releasing block 303 through a nonconductive tape 302, mounting a semiconductor element 304, with an adhesive 305 such as an epoxy resin, on the surface of a heat-releasing block 303 on which the inner 301 is attached, connecting an electrode pad (not shown in the illustration) of the semiconductor element 304 to the inner lead 301 with a wire 306 such as gold wire, and subsequently sealing with a resin portion 307. According to the above-mentioned embodiment, a lead flame with a fine inner lead pitch can be used to shorten the length of the connecting wires, even when a miniaturized semiconductor element is mounted, preventing short circuiting of the wires or other problems during the resin-sealing step.

Figure 4:
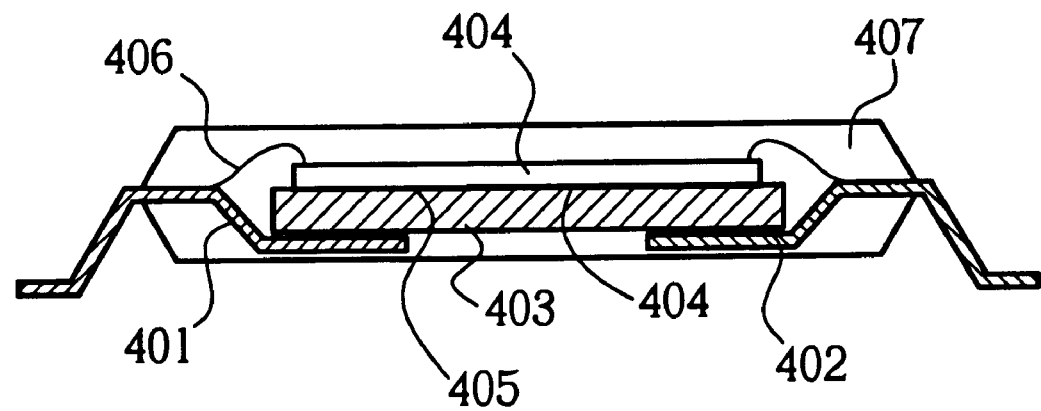
FIG. 4 is a view illustrating a semiconductor device in accordance with another embodiment of the present invention.

FIG. 4 is a view illustrating another embodiment of the present invention. It shows an inner lead 401 having a bent portion fixed to a heat-releasing block 403 through a non-conductive tape 402. On the surface of a heat-releasing block 403 opposite to which the inner lead 401 is attached, a semiconductor element 404 is attached with an adhesive 405 such as an eopxy resin. The electrode pad (not shown in the illustration) of the semiconductor element 404 is connected to the inner lead 401 with a wire 406 such a gold wire.

As with the present embodiment, the heat-releasing block 403 is also placed at a position intersecting the center of the resin portion 407. However, the center of the heat-releasing block 403 and the center of the resin portion 407 do not coincide in the present embodiment; rather, the center of the resin portion 407 is positioned closer toward the face of the heat-releasing block 403 to which the semiconductor element 404 is attached. The arrangement such as above brings the thickness of the resin portion 407 above the face of the semiconductor element 404 at the opposite side of the heat-releasing block 403 and that above the face of the heat-releasing block 403 at the opposite side of the semiconductor element 404 roughly equal. It therefore ensures a smooth flow of resin during the resin-sealing step and prevents filling defects.

According to the present embodiment, the semiconductor element 404 has a size nearly equal to the heat-releasing block 403. In such a case, a smooth flow of resin is enabled by equalizing the thickness of the resin portion 407 on the side of heat-releasing block 403 and the semiconductor element 404, rather than simply bringing the thickness of the resin portion 407 equal on both sides of the heat-releasing block 403.

Alternatively, multiple smaller semiconductor elements may be mounted in place of the semiconductor element 404 in the present embodiment.

Figure 5:
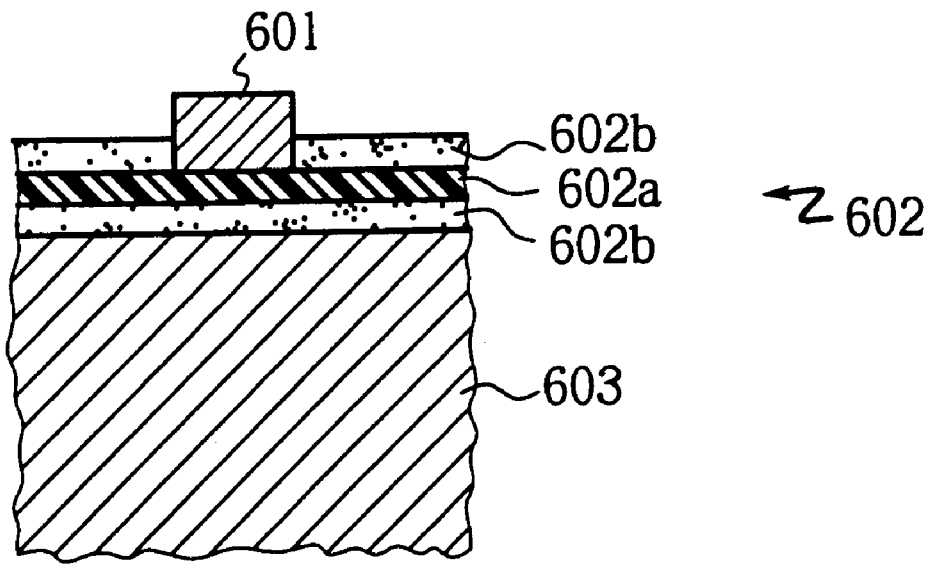
FIG. 5 is a partial view illustrating a semiconductor device in accordance with another embodiment of the present invention.

FIG. 5 illustrates a modification of the semiconductor device shown in FIG. 1 and is a part of a cross-sectional view through the V—V plane of the FIG. 1. As shown in the illustration, a tape 602 for bonding an inner lead 601 and a heat-releasing block 603 comprises adhesive layers 602b provided on both sides of a core tape 602a. Additionally, the inner lead 601 is arranged in such a way that it intrudes into one of the adhesive layers 602b, extending to the core tape 602a directly underneath it. Such an arrangement prevents a faulty wire bonding caused by the adhesive layer 602b becoming soft and acting as a cushion under the temperature (i.e. 250 to 260° C.) encountered at the time of bonding.

To obtain this configuration, a pressure of four to five times the pressure used in the conventional way (i.e. approximately 200 kg-f) may be applied between the inner lead 601 and the heat-releasing block 603 before performing the aforementioned step of fabricating the semiconductor device.

Figure 6:
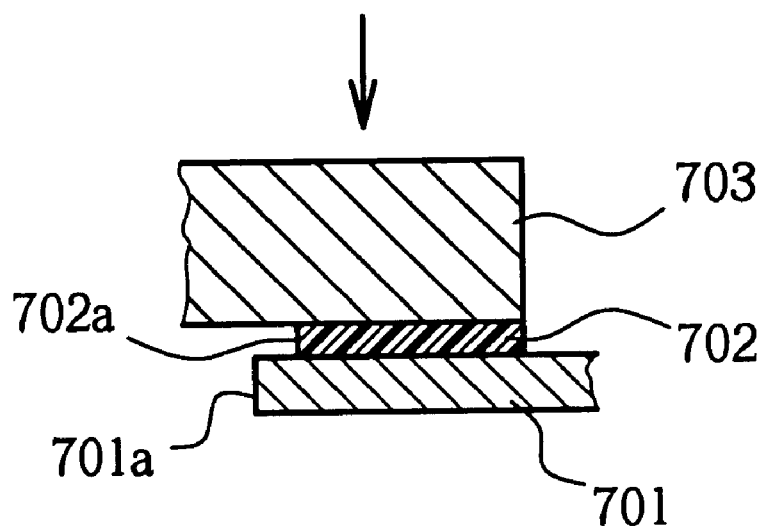
FIG. 6 is a partial view illustrating a semiconductor device in accordance with another embodiment of the present invention.
Figure 7:
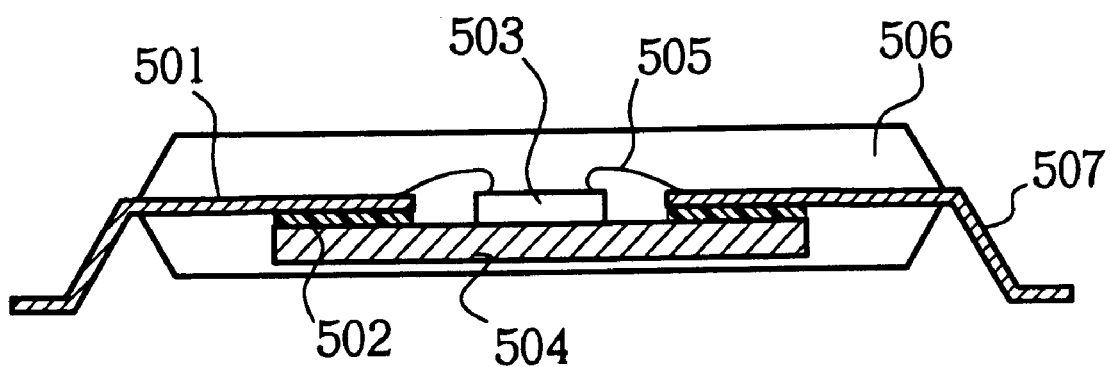
FIG. 7 is a cross-sectional view illustrating a conventional art semiconductor device with improved heat releasing capability.

Next, FIG. 6 is an example of a means to prevent the tape separation. Namely, an inner lead 701 is attached to one side of a heat-releasing block 703 using a tape 702 having adhesives on both sides.

In the above arrangement, the inner lead 701 protrudes from the tape 702 toward the center-side of the heat-releasing block 703 (i.e. approximately 0.1 to 0.5 mm). In other words, the tape 702 ends inside of the center-side tip of the inner lead 701 on the heat-releasing block 703.

When pressure is applied between the inner lead 701 and the heat-releasing block 703 to bond them, the pressure is applied fully to the side end 702a of the tape 702 since the tip 701a of the inner lead protrudes further than the tape 702. Thus the adhesion of the tape 702 to the heat-releasing block 703 is increased as well as the adhesion of the inner lead 701, to also improve the stability of the wire bonding.

Note that the same effect could be obtained by bringing the face of the tip 701a of the inner lead 701 flush with the side end 702a of the tape 702.

What is claimed is:

1. A resin-sealed type semiconductor device comprising:

a semiconductor element having electrodes;

a radiator facilitating divergence of heat from said semiconductor element;

a lead having an inner lead portion and an outer lead portion; and a resin portion sealing and embedding said semiconductor element, said radiator and said inner lead portion, said semiconductor element and said inner lead portion attached to said radiator, said radiator placed to intersect a center of a thickness-wise direction of said resin portion, said inner lead portion formed with its end spaced from said center of said thickness-wise direction of said resin portion, said inner lead portion bent toward a direction of said center of said thickness of said resin portion, and said outer lead portion protruding from a position of said center of said thickness of said resin portion.

2. The semiconductor device according to claim 1, wherein said semiconductor element is attached approximately at a central region of said radiator in a direction perpendicular to said thickness-wise direction of said resin portion, and said inner lead portion is attached at an outer perimeter of said radiator on a side of said radiator to which said semiconductor element is attached.

3. The semiconductor device according to claim 1, wherein said semiconductor element is attached to one of sides of said radiator, and said inner lead portion is attached to another of said sides of said radiator.

4. The semiconductor device according to claim 1, wherein said radiator is made of aluminum and is provided with a porous surface by anodic oxidation treatment.

5. The semiconductor device according to claim 1, wherein a surface of said radiator is treated with a roughening finish.

6. The semiconductor device according to claim 1, wherein a surface of said radiator is treated with ceramic flame-spraying.

7. The semiconductor device according to claim 1, wherein a surface of said radiator is treated with a blackening finish.

8. The semiconductor device according to claim 1, wherein said inner lead portion of said lead is attached to said radiator with a dielectric material having adhesive materials on both of its sides, said inner lead portion is attached so that it intrudes into one of said adhesive materials of said dielectric material.

9. The semiconductor device according to claim 1, wherein said inner lead portion of said lead is attached to said radiator with a dielectric material having adhesive materials on both of its sides, said dielectric material has its end positioned under a tip of said inner portion on a center side of said radiator.

10. A method of making a resin-sealed type semiconductor device comprising:

a first step of placing at predetermined positions a semiconductor element having electrodes, a lead having an outer lead portion and a partially bent inner lead portion, and a radiator to which said semiconductor element and said inner lead portion are attached, said radiator facilitating divergence of heat from said semiconductor element; and, a second step of forming a resin portion sealing said semiconductor element, said radiator, and said inner lead portion of said lead, in said first step, said radiator is placed at a position intersecting a center of a thickness of said resin portion, and a junction between said inner lead portion and said outer lead portion is placed at said center of said thickness of said resin portion through a bent portion of said inner lead portion.

11. The method of making a semiconductor device according to claim 10, wherein said radiator is made of aluminum, and said radiator is provided with anodic oxidation treatment prior to performing said first step.

12. The method of making a semiconductor device according to claim 10, wherein prior to performing said first step, said radiator is provided with an electroplating treatment using an electric current density that is large enough to cause a surface roughening phenomenon.

13. The method of making a semiconductor device according to claim 10, wherein said radiator is treated with sandblasting to roughen a surface of said radiator prior to performing said first step.

14. The method of making a semiconductor device according to claim 10, wherein a surface of said radiator is treated with ceramic flame-spraying prior to performing said first step.

15. The method of making a semiconductor device according to claim 10, wherein a surface of said radiator is treated with a blackening finish prior to performing said first step.

16. The method of making a semiconductor device according to claim 10, wherein said first step comprises:

a step of attaching said inner lead portion of said lead to said radiator with a dielectric material having adhesive materials on its both sides; and a step of applying a pressure between said inner lead portion and said dielectric material so that said inner lead portion is caused to intrude into one of said adhesive materials on said dielectric material.

17. The method of making a semiconductor device according to claim 10, wherein said first step comprises:

a step of pasting a dielectric material having adhesive materials on both of its sides to an outer perimeter of said radiator;

a step of pasting said inner lead portion to said dielectric material in such a way that said inner lead portion extends at least to an end of said dielectric material on a side of a center of said radiator or closer to said center; and a step of applying pressure to an area between said inner lead portion and said radiator.

* * * * *